United States Patent [19]

Moran

[11] Patent Number: 5,795,355
[45] Date of Patent: Aug. 18, 1998

[54] INTEGRATED MICRO-ENVIRONMENT CONTAINER LOADER APPARATUS HAVING A SEMIPERMEABLE BARRIER

[75] Inventor: J. Christopher Moran, Saratoga, Calif.

[73] Assignee: Applied Materials, Inc., Santa Clara, Calif.

[21] Appl. No.: 773,011

[22] Filed: Dec. 24, 1996

[51] Int. Cl.$^6$ .......................... H01L 21/68; B65G 49/07
[52] U.S. Cl. ..................... 29/25.01; 438/61; 438/907
[58] Field of Search .............................. 29/25.01; 438/61, 438/907

[56] References Cited

U.S. PATENT DOCUMENTS

| | | | |
|---|---|---|---|
| 4,582,219 | 4/1986 | Mortensen et al. | 220/326 |
| 4,709,834 | 12/1987 | Mortensen et al. | 220/326 |
| 4,892,141 | 1/1990 | Lebaton . | |
| 4,995,430 | 2/1991 | Bonora et al. | 141/98 |
| 5,019,139 | 5/1991 | LePack et al. . | |
| 5,340,384 | 8/1994 | Sims . | |

Primary Examiner—David Graybill
Attorney, Agent, or Firm—Michael A. Glenn

[57] ABSTRACT

An integrated wafer loader is provided for use with a vacuum process chamber. At least one semipermeable membrane provided in the separator between upper and lower chambers of a load lock permits air flow while preventing particulate matter transfer. A micro-environment container is sealed within the upper chamber and a vacuum simultaneously produced in both upper and lower chambers. A movable carrier plate opens the micro-environment container and removes a cassette of wafers from therein and into the lower chamber. The micro-environment container remains supported by the separator and forms an impermeable barrier between the chambers. Wafers are transferred from the cassette to the process environment, and returned to the cassette after processing has been completed. The carrier plate returns the cassette containing the processed wafers to the micro-environment container for removal from the load lock chamber.

28 Claims, 10 Drawing Sheets

INTEGRATED MICRO-ENVIRONMENT CONTAINER LOADER APPARATUS HAVING A SEMIPERMEABLE BARRIER

BACKGROUND OF THE INVENTION

1. Technical Field

The invention relates to the handling of precision workpieces, such as semiconductor wafers. More particularly, the invention relates to the transfer of semiconductor wafers between a sealed container and a sealed processing environment.

2. Description of the Prior Art

Semiconductor fabrication requires a sophisticated clean room environment to prevent contamination of the semiconductor wafers by foreign particles, such as dust. Such environment is extremely difficult to manufacture, and to maintain. As device geometry decreases, the acceptable level of particulate matter in the clean room must also be decreased.

Similarly, when semiconductor wafers are transported, a clean, relatively particle-free micro-environment must be provided. It is well known in the prior art to use a wafer carrier container known as a standard mechanical interface (SMIF) box to transport the wafers. The SMIF-type box, is used to transport and handle the semiconductor wafers in small sealed containers that provide an appropriate clean environment. Containers of this type include those described in Bonora et al (U.S. Pat. No. 4,995,430) and Mortensen et al (U.S. Pat. Nos. 4,709,834 and 4,582,219).

It is necessary, however, to also provide a clean environment in which the wafers are removed from the micro-environment container and delivered to the vacuum process chamber. This has typically been accomplished through use of automatic transfer operations. In such operation, a cassette of wafers may be placed onto a machine that automatically transfers the wafers from the cassette to the processing apparatus, and back.

The prior art teaches use of an atmosphere transfer chamber or a separate vacuum hand-off chamber, and a vacuum wafer transport mechanism. A vacuum transfer system is advantageous because it introduces fewer contaminating particles into the process environment than an atmospheric transfer system. Such transfer or hand-off chambers may incorporate mechanisms for opening the wafer carrier container after the chamber has been pumped down. The wafer cassette is thereby moved from the wafer carrier container and the wafers transferred to and from the processing equipment. The SMIF box provides an industry-standard interface between the box and the transfer or hand-off chamber.

The typical prior art atmosphere transfer or vacuum hand-off chamber includes two separate chambers. The chambers are typically separated by a gate valve or other positive barrier device to minimize particle cross-over between the chambers, and to permit the chambers to be pumped down to a vacuum.

FIG. 1 is a side sectional view of a vacuum process system 10 according to the prior art. A wafer carrier, such as a SMIF box 12, is placed into a separate load/unload mechanism 14 through a port 24. The load/unload mechanism separates the wafer cassette 16 from the SMIF box and transfers the cassette to the vacuum hand-off chamber 20. Individual wafers are subsequently removed from the cassette and transferred to the vacuum process chamber 22.

FIG. 2 is a front view of the upper chamber of a vacuum hand-off chamber according to the prior art. The wafer cassette is placed onto a plate 26 in the upper chamber 28. The upper chamber is then sealed and evacuated. A gate valve device 30 is provided between the upper and lower chambers. Once pump-down has been completed, the wafer cassette is transferred to the lower, sealed and evacuated chamber 32.

FIG. 3 is a rear view of the lower chamber of a vacuum hand-off chamber according to the prior art. Once transferred to the lower chamber, the cassette is opened and the individual wafers 34 contained therein are transferred to the vacuum process chamber 22.

FIG. 4 is a side sectional view of a vacuum process chamber according to the prior art. An end-effector 36 removes the wafers 34 from the cassette for transfer to the vacuum process chamber. The end-effector may be provided with one or more wafer transports 38, thereby permitting the transfer of one or more wafers at a time to and from the vacuum process chamber. When every wafer in the cassette has been processed, the cassette is returned to the SMIF box in the upper chamber.

Such handling scheme thus requires the use of the two sealed chambers within the vacuum hand-off chamber, the vacuum process chamber, and a load/unload mechanism to transfer a wafer from the load lock to the process chamber. The load/unload mechanism requires a relatively large amount of space in the clean room containing the process chamber. Because the costs of maintaining such clean room floor space are at a premium, any increase in clean room area can add considerable expense to the fabrication process.

The chamber volumes associated with the vacuum process chamber, vacuum hand-off chamber, SMIF box and load/unload mechanism must all be pumped down to achieve a vacuum during semiconductor processing. The time required to pump down these volumes extends the cycle time of each wafer processed. Thus, increasing the amount of pump-down time will reduce the speed at which wafers are processed, limiting wafer throughput. Use of a load/unload mechanism, with its additional volume therefore increases the total process time.

Another disadvantage of the use of a separate load/unload mechanism is the additional time required by the physical movement of the wafers by the mechanism. The wafer handling mechanism must be precisely aligned to properly transfer the wafers. Such precision alignment is expensive to achieve and maintain. Furthermore, such equipment also requires additional seals at the SMIF box and the processing equipment. The port 18 through which the cassette is placed into the first chamber, is typically provided with an O-ring type seal 20 to maintain the vacuum within the chamber. Such seals are subject to failure. Thus, use of the separate load/unload mechanism increases the possibility of introducing contaminant particles into the processing equipment.

It is also known to provide a single chamber transfer system. A SMIF box is placed onto the mechanism, and the wafer cassette lowered into the chamber. Thus, the SMIF box effectively is an upper chamber. However, such systems are not used with a vacuum load lock system. Rather, it must be operated with atmospheric transfer system.

It would therefore be advantageous to provide a wafer transfer apparatus that does not require a separate load/unload mechanism. It would be a further advantage if such load lock mechanism permitted simultaneous pump-down of both chambers while eliminating particle cross-over into the lower chamber from the outside of the wafer carrier.

SUMMARY OF THE INVENTION

The invention provides an integrated wafer loader for use with a vacuum process chamber. A separator divides a vacuum hand-off chamber into upper and lower chambers. A micro-environment container is sealed within the upper chamber. In the preferred embodiment of the invention, the micro-environment container is a SMIF box. At least one semipermeable membrane is provided in the separator to permit air flow while preventing particulate matter transfer from the upper to the lower chamber. A vacuum is simultaneously produced in both upper and lower chambers through the semipermeable membrane. When a vacuum has been achieved, a movable carrier plate opens the micro-environment container and removes a cassette of wafers from therein and into the lower chamber. The micro-environment container remains supported by the separator and forms an impermeable barrier between the chambers. Wafers are transferred from the cassette to the process environment, and returned to the cassette after processing has been completed. The carrier plate returns the cassette containing the processed wafers to the micro-environment container for removal from the vacuum hand-off chamber.

DETAILED DESCRIPTION OF THE INVENTION

The invention provides an integrated micro-environment container loader for use with a vacuum process chamber. The invention is especially adapted for use with various vacuum load lock handling systems, such as the Centura and Endura platforms manufactured by Applied Materials, Inc. of Santa Clara, Calif. However, the invention may also be used with any other appropriate wafer handling systems, including systems that provide single and multiple processing chambers.

Figure 1:
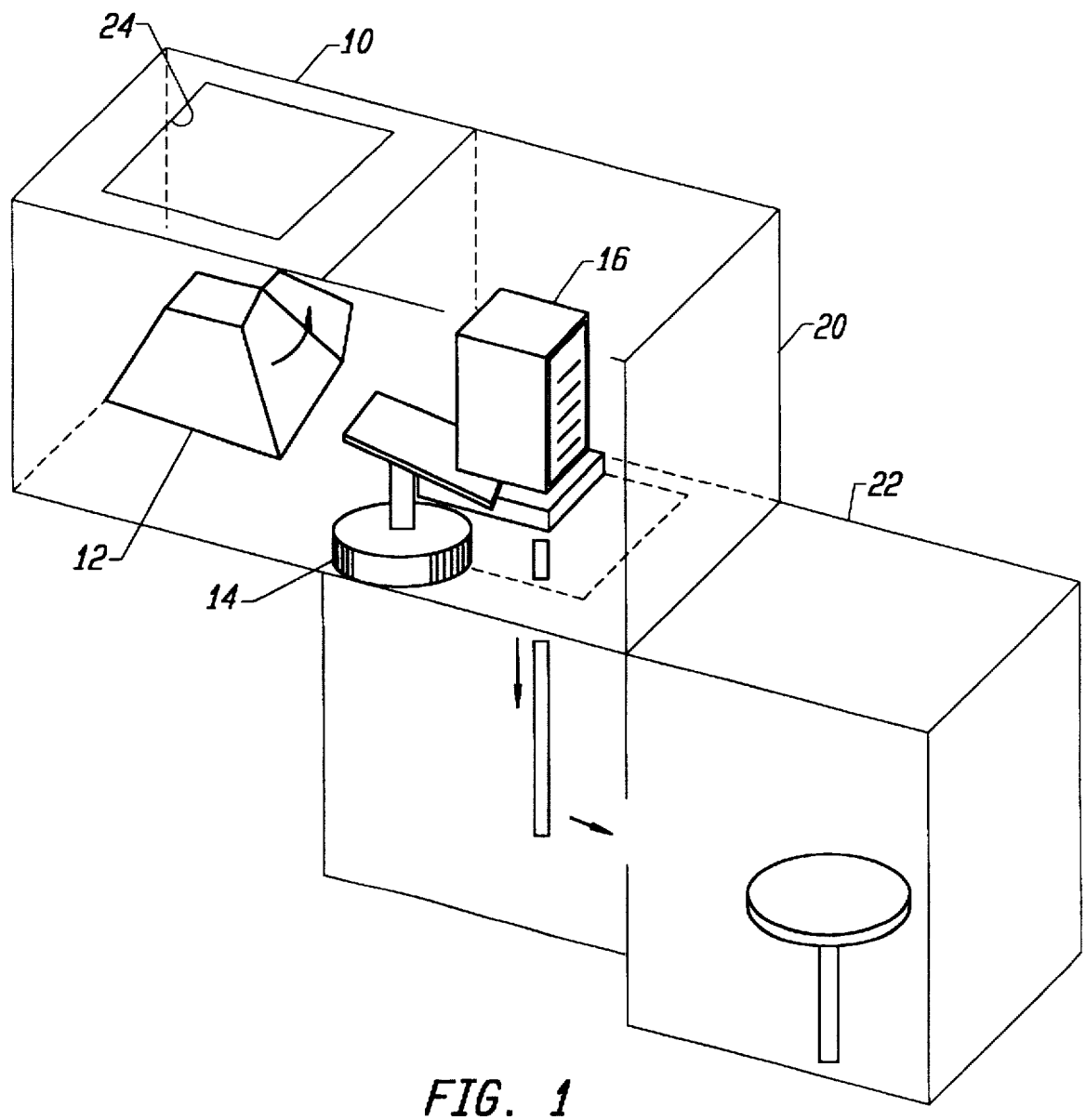
FIG. 1 is a side sectional view of a vacuum process system according to the prior art.
Figure 2:
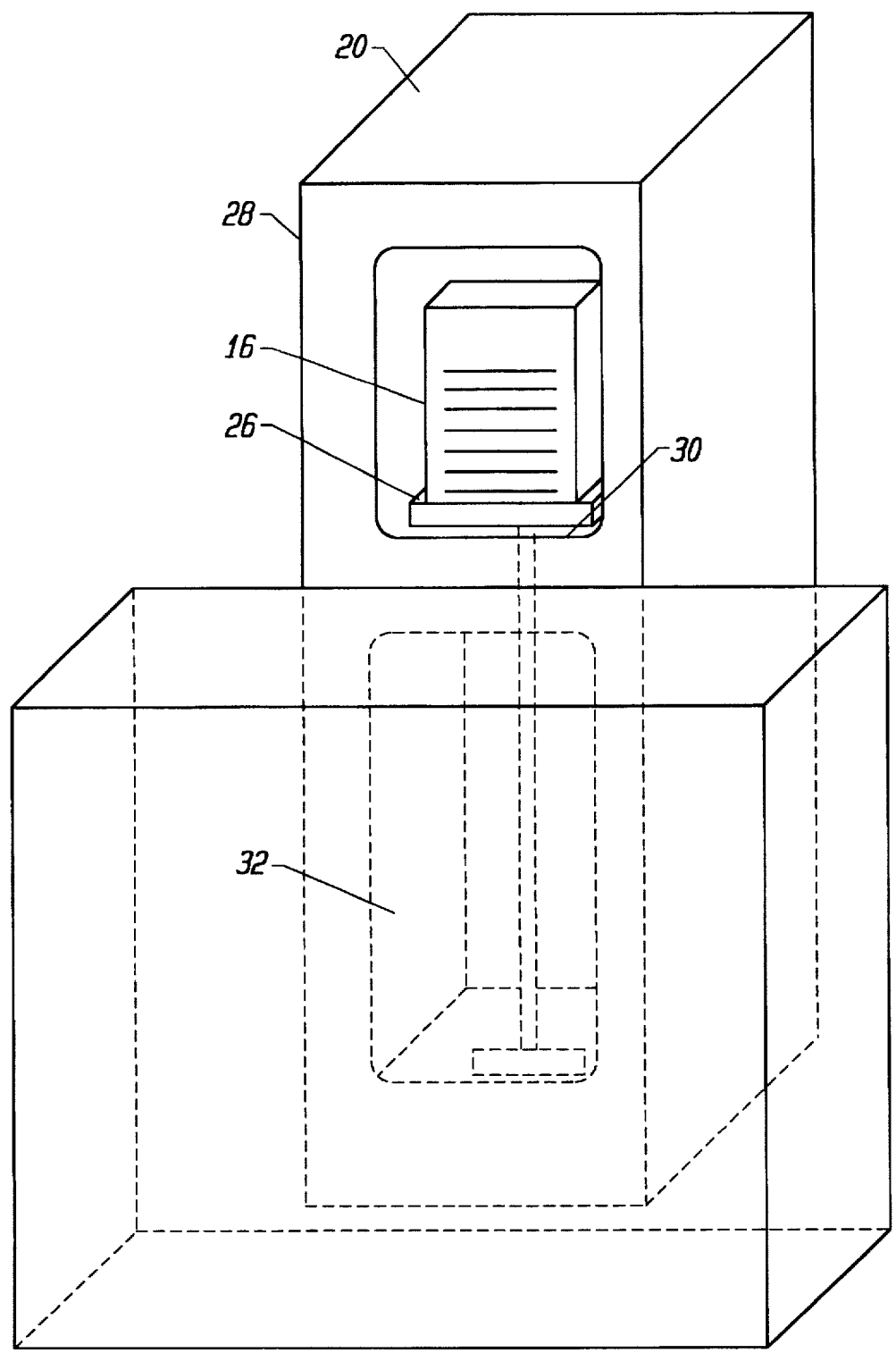
FIG. 2 is a front view of the upper chamber of a vacuum hand-off chamber according to the prior art.
Figure 3:
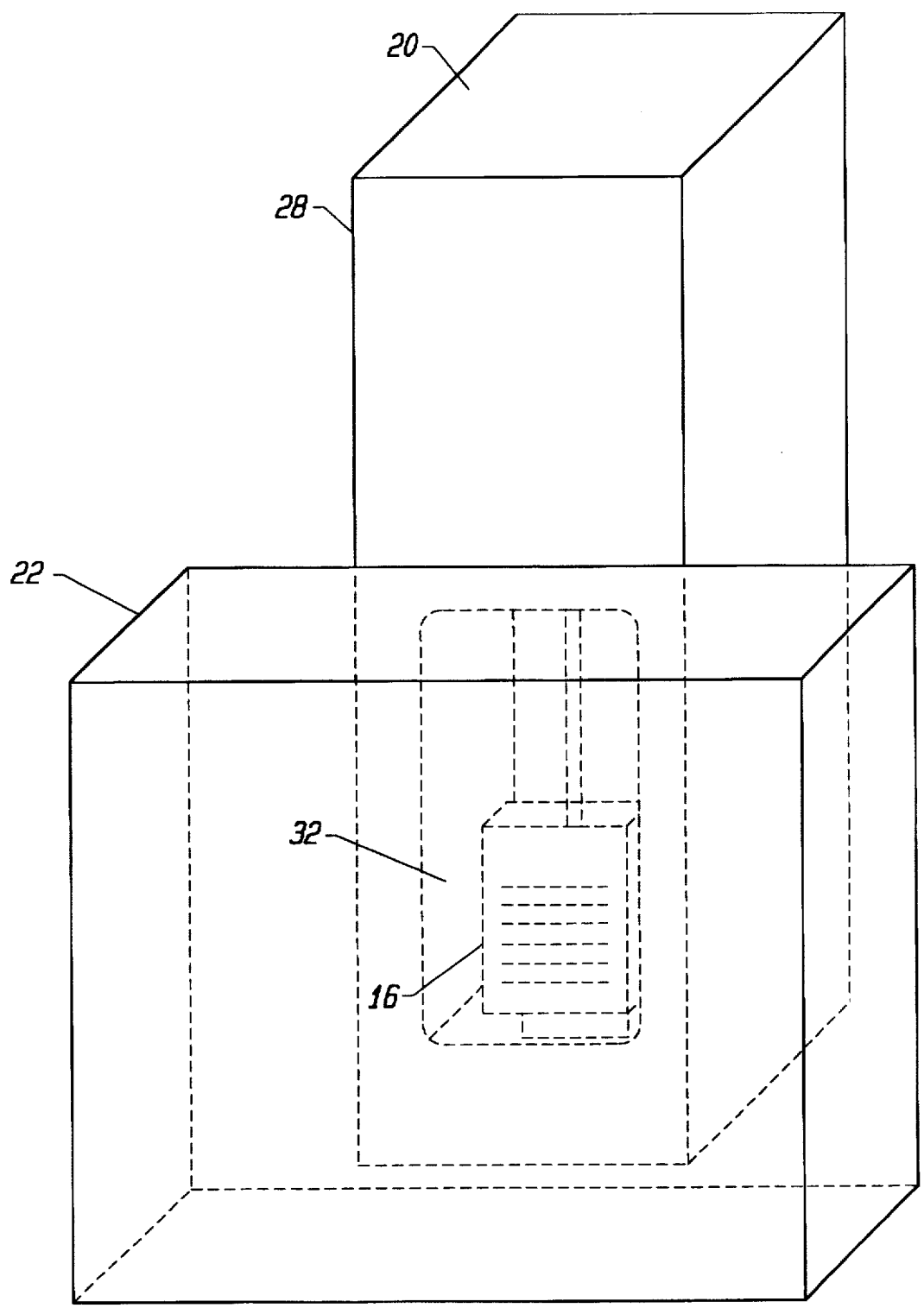
FIG. 3 is a rear view of the lower chamber of a vacuum hand-off chamber according to the prior art.
Figure 4:
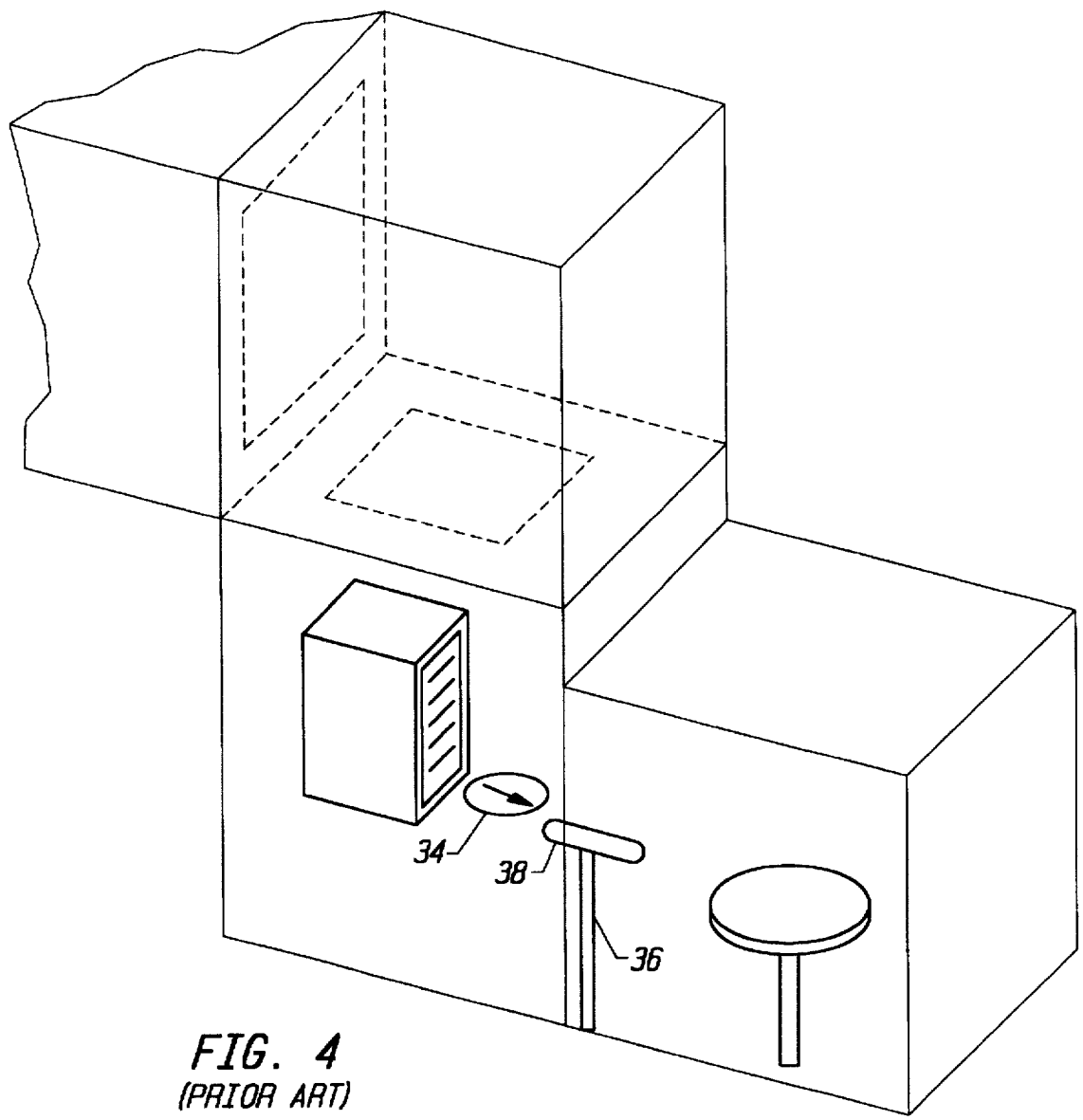
FIG. 4 is a side sectional view of a vacuum process chamber according to the prior art.
Figure 5:
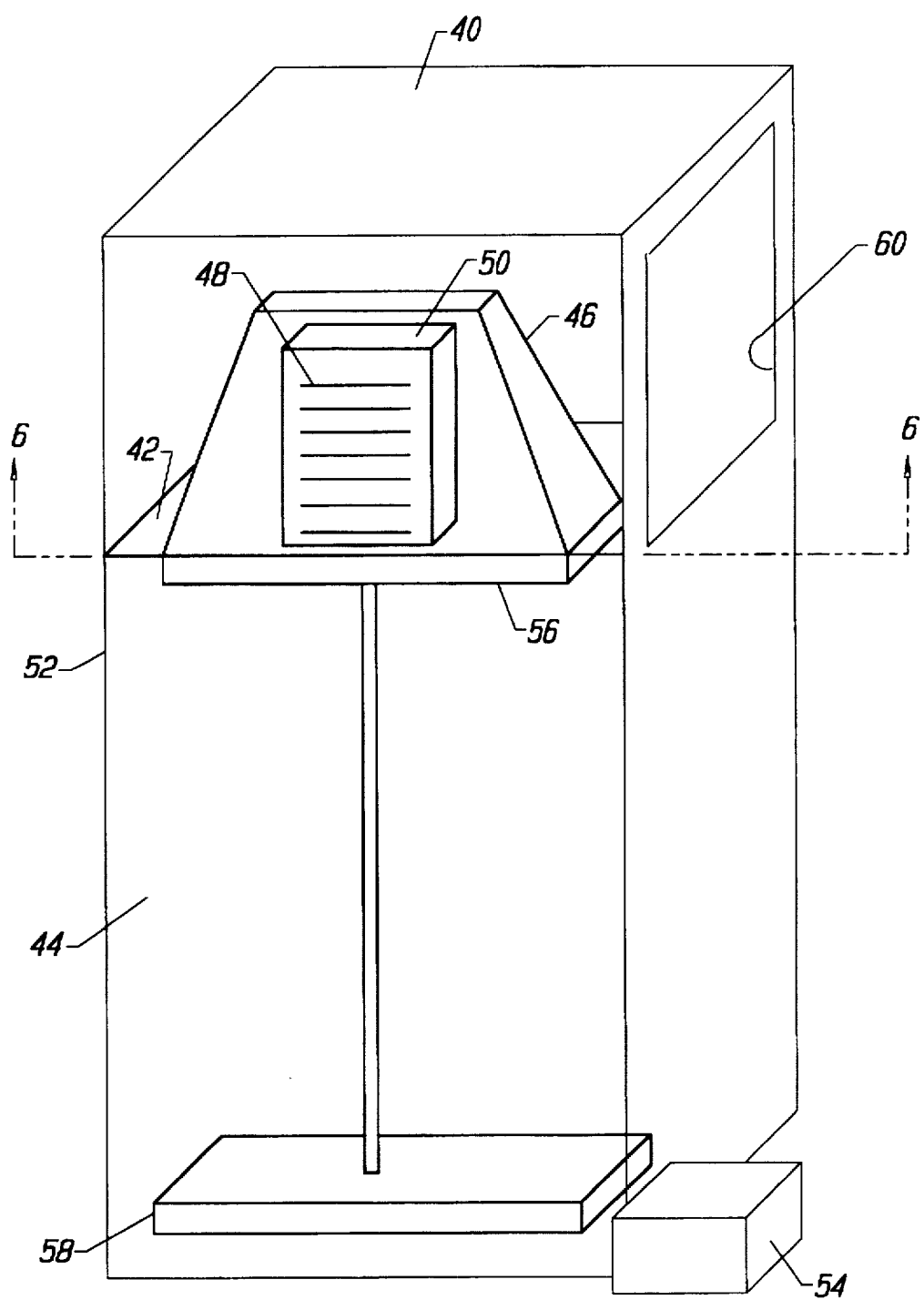
FIG. 5 is a front sectional view of the integrated micro-environment container loader apparatus according to the invention.

FIG. 5 is a front sectional view of the integrated micro-environment container loader apparatus 52 according to the invention. In the preferred embodiment of the invention, this micro-environment container is a SMIF box. However, one skilled in the art will readily appreciate that the invention may also be applied to other types of micro-environment containers suitable for placement in a vacuum environment.

According to the present invention, the micro-environment container 46 containing the wafer cassette 48 is placed directly into the loader apparatus through either a top or a side port 60 in the upper chamber. This placement may be accomplished automatically (e.g. by an appropriate robot or conveyer system), or by manual means. However, no separate load/unload mechanism is required.

The micro-environment container is placed onto a stationary separator 42 that includes a carrier plate 56. The carrier plate comprises a movable portion of the separator 42. The stationary separator 42 divides the loader apparatus into distinct upper 40 and lower 44 chambers. A separating mechanism 53 (see FIG. 7 for more detail) opens the micro-environment container, and (along with the carrier plate 56) lowers the bottom of the container 59 and the cassette together into the lower chamber 44. The stationary separator 42 also defines a ledge. While the bottom of the container 59 and the cassette are separated from the micro-environment container and lowered into the lower chamber 44, the walls of the micro-environment container rest on the ledge defined by the stationary separator.

Figure 6:
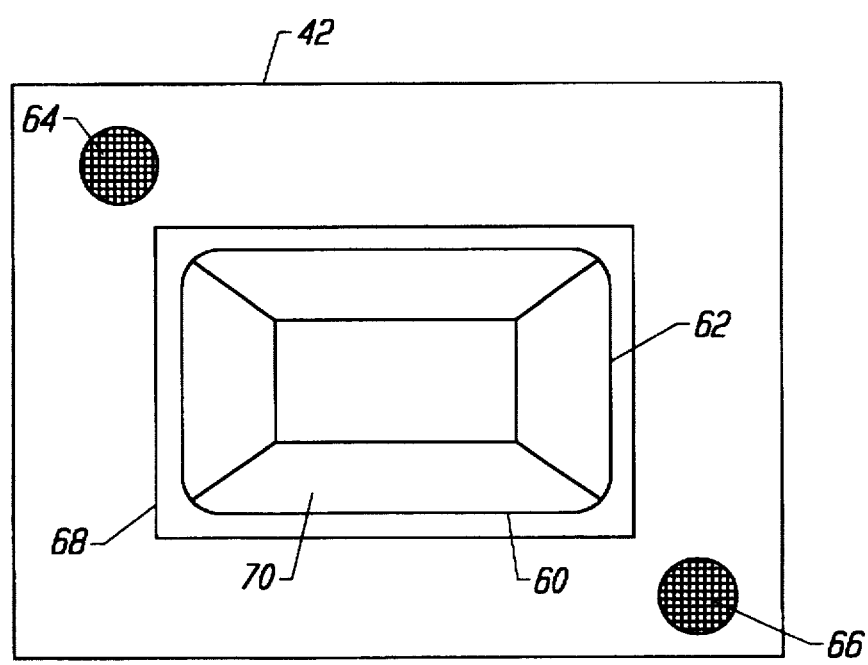
FIG. 6 is a bottom sectional view along section A—A of the integrated micro-environment container loader apparatus according to the invention.

FIG. 6 is a bottom sectional view along section A-A of the integrated micro-environment container loader apparatus, according to the invention. A mechanical opening 60 is defined through the separator 42. The base 68 of the micro-environment container covers this mechanical opening and overlaps the edges of the separator 62. The wafer cassette is separated from the micro-environment container and transferred into the lower chamber through the opening.

A semipermeable membrane 64 is provided in at least one aperture 66 in the separator to permit air flow between the upper and lower chambers during vacuum pump down. Such semipermeable membrane, however, forms a barrier to particulate matter larger than the membrane's pores. A vacuum pump 54 (shown in FIG. 5) which is joined to the lower chamber can therefore pump both of the chambers down simultaneously. The invention is operable with a single vacuum pump, rather than the multiple pumps required to provide the differential pumping down of the upper and lower chambers, as required by the prior art.

Figure 7:
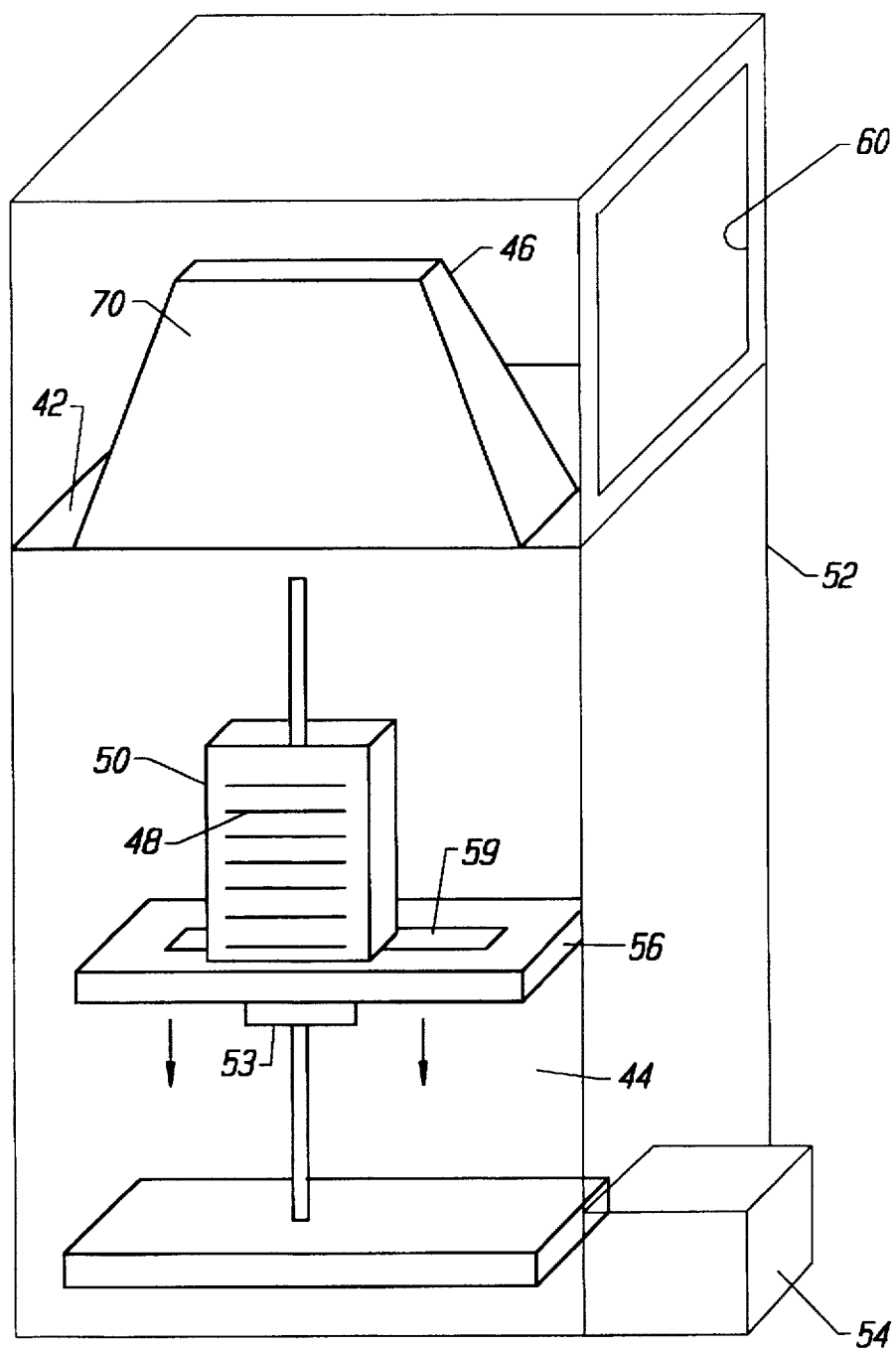
FIG. 7 is a front sectional view of the integrated micro-environment container loader apparatus according to the invention.

FIG. 7 is a front sectional view of the integrated micro-environment container loader apparatus according to the invention. The base 68 and walls 70 of the micro-environment container are supported by the separator 42 and thus form an impermeable barrier between the lower chamber and the upper chamber. Air flow is permitted only through the semi-permeable membranes 64 to establish the vacuum. When a vacuum has been achieved, the micro-environment container is opened and the carrier plate 56 lowers the wafer cassette from the micro-environment container into the lower chamber 44.

Figure 8:
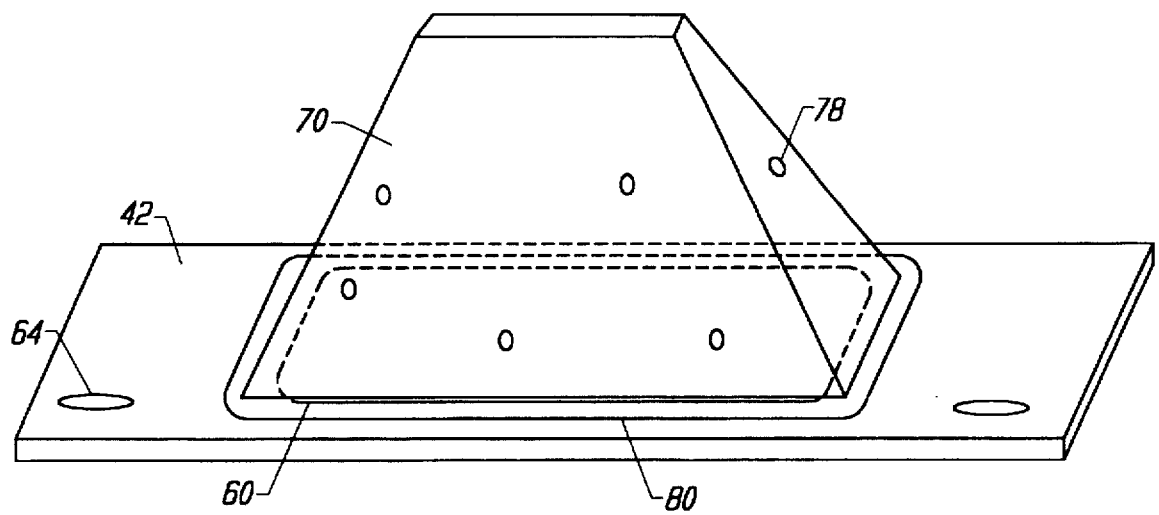
FIG. 8 is a front view of the micro-environment container and separator ledge prior to vacuum pump-down according to the invention.

FIG. 8 is a front view of the micro-environment container and separator ledge prior to vacuum pump-down. The exterior of the micro-environment container is exposed to the outside environment. Thus, contaminating particles 78 are deposited on the outside of the container. Contaminating particles from the outside of the box are isolated from the lower chamber by the micro-environment container walls 70.

In a preferred embodiment of the invention, at least two semipermeable membranes 64 are provided through the separator. However, one skilled in the art will readily appreciate that the size, number, and configuration of the semipermeable membranes may be varied according to the size of the load lock chambers, or to suit particular process requirements. The number of semipermeable membranes is determined according to the size of the upper and lower chambers, the size of the vacuum pump, and the desired pump down time. The membranes are also sized to maintain a laminar flow within the chamber enclosure.

Figure 9:
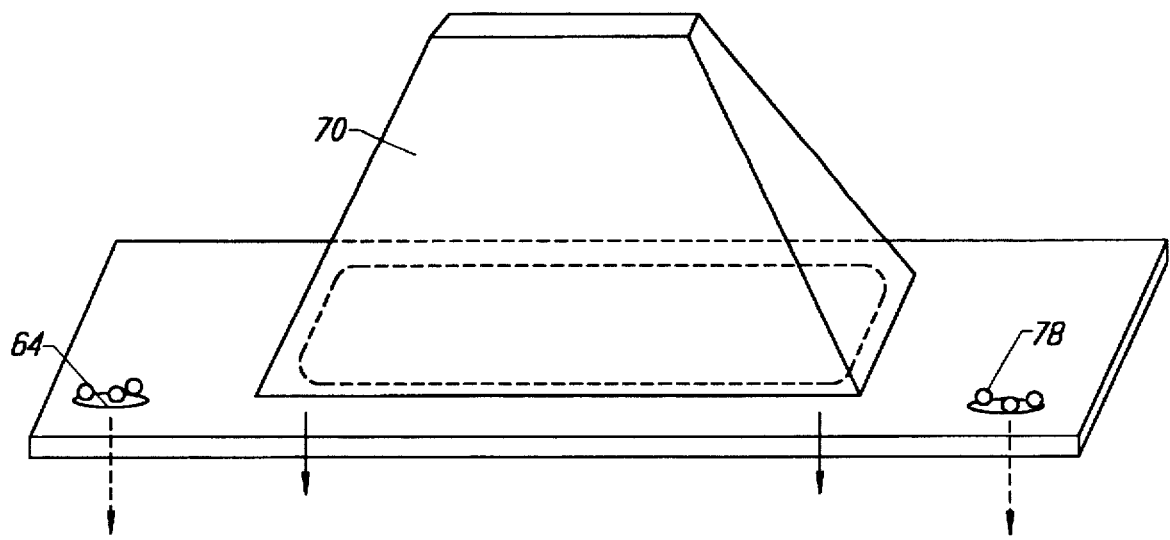
FIG. 9 is a front view of the micro-environment container and separator ledge subsequent to vacuum pump-down according to the invention.

FIG. 9 is a front view of the micro-environment container and separator ledge subsequent to vacuum pump-down. Air flow actuated by the vacuum pump through the membranes produces a vacuum in both upper and lower chambers. The vacuum urges the micro-environment container against the separator. The micro-environment container thus remains in the upper chamber, providing an impermeable cover to seal the opening. Contaminating particulate matter 78 is trapped by the semipermeable membranes. Because the interior of the micro-environment container is a clean environment, the lower chamber remains contaminant-free.

The semipermeable membranes may be formed of any non-shedding, non-outgassing, high efficiency filtration system. In one preferred embodiment, the semipermeable membrane is a High Efficiency Particulate Air filter (HEPA). In another equally preferred embodiment, the semipermeable membrane is an Ultra Low Particulate Air filter (ULPA). However, one skilled in the art will readily appreciate that any appropriate particle-trapping barrier or small-pored semipermeable filtration system may be used.

The semipermeable membranes preferably trap particles equal to, or greater than, 0.01 µm in size. However, the permeability of the membranes may be varied to suit the particular requirements of the process. Thus, membranes may be provided to permit larger particles to enter the process environment, or to trap particles smaller than 0.01 µm in size.

The pressure differential between the chambers is significantly reduced over that of the prior art through use of the semipermeable membranes. This reduced differential minimizes the possibility of collapsing the cassette or micro-environment container, or of failing to obtain a good vacuum seal. In one embodiment of the invention, a soft seal gasket 80 or separator is provided at the opening to prevent gas from bypassing the semipermeable membranes.

The invention does not require a gate valve or other positive barrier device as required by the prior art. Seal failure is thereby minimized and the expenses associated with providing such barrier devices and maintaining the vacuum therewith are eliminated.

Figure 10:
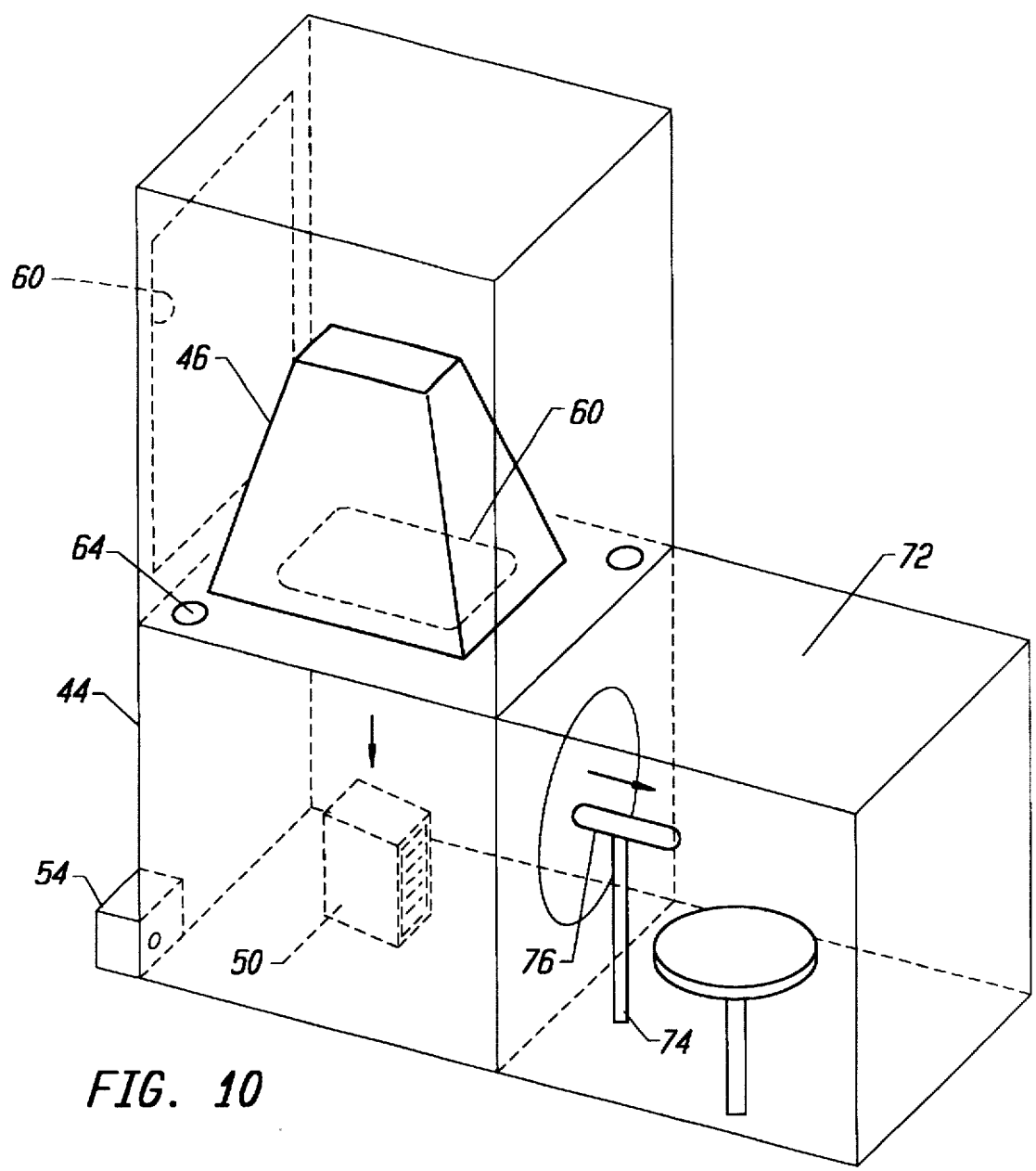
FIG. 10 is a side sectional view of the integrated micro-environment container loader apparatus according to the invention.

FIG. 10 is a side sectional view of the integrated micro-environment container loader apparatus according to the invention. In the figure, a wafer is removed from the cassette and transferred to the process environment 72. In a preferred embodiment of the invention, one wafer is transferred at a time for processing. In another, equally preferred, embodiment, multiple wafers are transferred at the same time to the process environment. The end-effector 74 used to transfer the wafers to the process chamber may thus have one or more wafer transports 76. For example, the wafer transport may be a wafer handling, as is well known in the art.

Thus, in operation the SMIF box is placed into the loader through a port 60 (as discussed above in connection with FIG. 5). The operation of the loader proceeds as described above, such that the wafer cassette is positioned within the lower chamber 44 of the loader. The wafer cassette may either be indexed as is known in the art to allow a single wafer at a time to be loaded into the process environment, or the entire complement of wafers contained within the cassette may be transferred to the process environment (for example, where the process environment performs batch processing). Transfer of individual wafers or of more than one wafer, is performed by the use of an effector, such as is well known in the art. Such transfer may occur along a horizontal or z-axis, as indicated by the arrow 101, or such transfer may occur along a vertical axis, in the event a top loading process environment is provided. Accordingly, actual wafer handling is not discussed in greater detail herein.

When processing is completed, the carrier plate returns the cassette to the micro-environment container. The chambers may then be returned to atmospheric pressure and the sealed micro-environment removed.

The invention replaces the prior art wide and narrow body load lock systems. Although a horizontal or z-axis loading application is described herein, the invention may be used with either horizontal and vertical wafer loading configurations. By employing the herein described invention in conjunction with a wafer loading apparatus, costs associated with the wafer handling mechanism, such as the expense of maintaining the required clean room floor space, are eliminated thereby reducing fabrication cost.

A vacuum transfer system, such as the invention, admits fewer contaminating particles into the process environment than does an atmospheric transfer system. Additionally, the maintenance of a vacuum in all of the chambers reduces process delays as wafers are moved among the various processing chambers because there is no need to wait for chamber pressures to be equalized before the wafers are transferred. The additional time required by the physical movement of the wafers by a separate load/unload mechanism is also eliminated. The invention therefore significantly increases wafer throughput.

Figure 11:
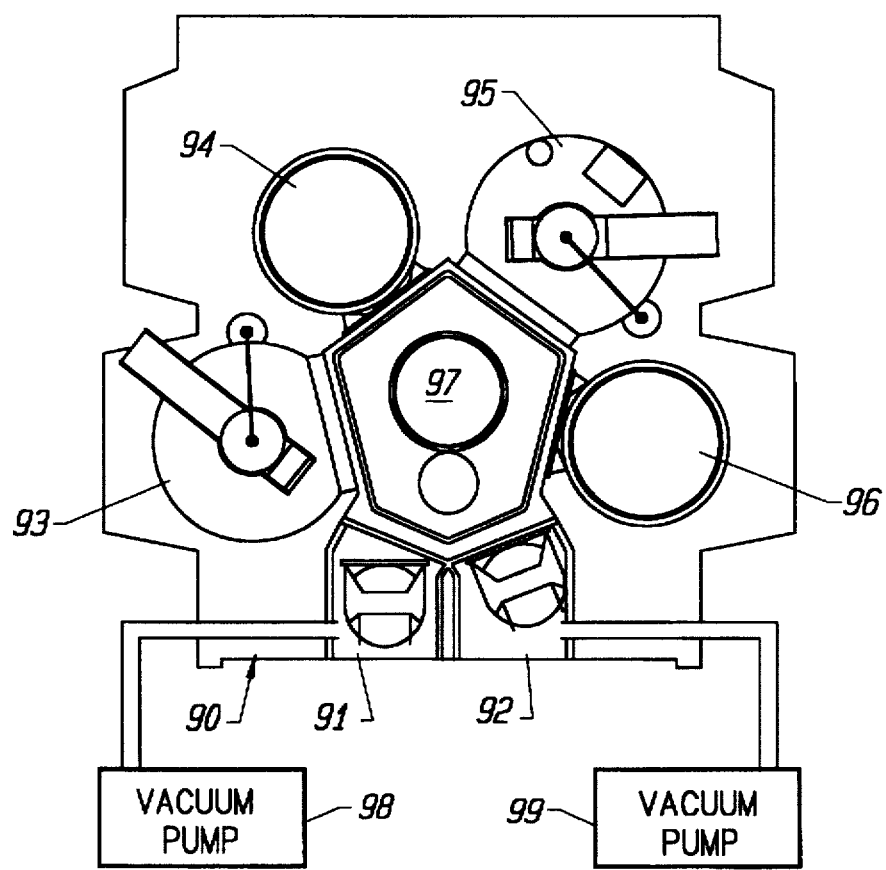
FIG. 11 shows a top view of a block diagram of a multiple chamber semiconductor wafer processing system according to the invention.

FIG. 11 shows a top view of a block diagram of a multiple chamber semiconductor wafer processing system 90 which includes two cassette load locks 91, 92, and which may be used for etching, for example, or for other processes involved in the fabrication of semiconductor wafers in any of a first processing chamber 93, a second processing chamber 94, a third processing chamber 95, and a fourth processing chamber 96. Such processing system also includes robotic equipment 97 for moving wafers to and from one or more of the processing chambers; and vacuum pumps 98 and 99 for providing a vacuum in load locks 91 and 92, respectively. Such a system is disclosed in M. Toshima, P. Salzman, S. Murdoch, C. Wang, M. Stenholm, J. Howard, L. Hall, D. Cheng, *Dual Cassette Load Lock*, U.S. Pat. No. 5,186,594 (16 Feb. 1993). Such systems are available from Applied Materials, Inc. of Santa Clara, Calif. (the Centura® multi-chamber system).

The invention herein is readily adapted for use with such multi-chamber systems. For example, a separate loading apparatus in accordance with the invention may be provided at each of the load locks 91, 92. In such application, the loading apparatus is fitted directly to the load lock. Thus, the invention is readily retrofitted to existing process environments, as well as provided as part of a newly manufactured system. It should be appreciated by those skilled in the art that any existing single chamber or multi-chamber process system is therefore readily adapted incorporate the herein described loading apparatus.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

I claim:

1. A wafer loading apparatus comprising:
   a load lock chamber for use with a process environment, said load lock chamber having an upper chamber for receiving a micro-environment container therein, and a lower chamber;
   a separator between said upper and lower chambers, said separator having least one aperture formed therethrough;
   movable carrier plate selectably operable to open and close said micro-environment container and to selectably remove a cassette of wafers from said micro-environment container and into said lower chamber, wherein said micro-environment container is supported by said separator to form an impermeable barrier between said lower chamber and said upper chamber; and
   a semipermeable barrier in said at least one aperture to prevent any particulate material in said upper chamber from entering said lower chamber;
   wherein said upper and lower chambers may be simultaneously evacuated.

2. The apparatus of claim 1, wherein said micro-environment container is a SMIF box.

3. The apparatus of claim 1, wherein said semipermeable barrier is a semipermeable membrane.

4. The apparatus of claim 1, wherein said semipermeable barrier is a non-shedding, non-outgassing, high efficiency filtration system.

5. The apparatus of claim 1, wherein said semipermeable barrier is selected from the group consisting of High Efficiency Particulate Air and Ultra Low Particulate Air filters.

6. The apparatus of claim 1, wherein said semipermeable barrier traps particles equal to, or greater than 0.01 μm in size.

7. The apparatus of claim 1, further comprising an end-effector having one or more wafer transports.

8. The apparatus of claim 1, further comprising means for transferring a wafer from said cassette to said process environment.

9. The apparatus of claim 8, wherein said transferring means transfers one wafer at a time to said process environment.

10. The apparatus of claim 9, wherein said transferring means transfers multiple wafers at one time to said process environment.

11. The apparatus of claim 1, wherein said apparatus is operable with horizontal and vertical wafer loading configurations.

12. The apparatus of claim 1, further comprising means to produce a vacuum in said upper and lower chambers.

13. A system for loading wafers from a micro-environment container to a process environment, comprising:
   a load lock chamber for use with a process environment, said load lock chamber having an upper chamber for receiving a micro-environment container therein, and a lower chamber;
   a separator between said upper and lower chambers, said separator having at least one aperture formed therethrough;
   a movable carrier plate selectably operable to open and close said micro-environment container and to selectably remove a cassette of wafers from said micro-environment container and into said lower chamber, wherein said micro-environment container is supported by said separator to form an impermeable barrier between said lower chamber and said upper chamber;
   a semipermeable membrane in said at least one aperture to prevent any particulate material in said upper chamber from entering said lower chamber;
   an end-effector having one or more wafer transports;
   a vacuum pump for simultaneously producing a vacuum in said upper and lower chambers; and
   means for transferring a wafer from said cassette to said process environment.

14. The apparatus of claim 13, wherein said semipermeable barrier is a non-shedding, non-outgassing, high efficiency filtration system.

15. The apparatus of claim 13, wherein said semipermeable barrier is selected from the group consisting of High Efficiency Particulate Air and Ultra Low Particulate Air filters.

16. The apparatus of claim 13, wherein said semipermeable barrier traps particles equal to, or greater than 0.01 μm in size.

17. The apparatus of claim 13, wherein said micro-environment container is a SMIF box.

18. The apparatus of claim 13, wherein said semipermeable barrier is selected from the group consisting of High Efficiency Particulate Air and Ultra Low Particulate Air filters.

19. A method for wafer loading, comprising the steps of:
   dividing a load lock chamber into upper and lower chambers with a separator having at least one aperture formed therethrough;
   providing a semipermeable membrane in said at least one aperture to prevent any particulate material in said upper chamber from entering said lower chamber;
   inserting a micro-environment container into said upper chamber;
   providing a movable carrier plate to selectably open and close said micro-environment container and to selectably remove a cassette of wafers from said micro-environment container and into said lower chamber;
   supporting said micro-environment container by said separator to form an impermeable barrier between said lower chamber and said upper chamber;
   simultaneously producing a vacuum in said upper and lower chambers; and
   transferring a wafer from said cassette to said process environment.

20. A semiconductor fabrication system, comprising:
   a plurality of processing chambers;
   at least one transfer chamber;
   means for transferring wafers between said transfer chamber and one or more of said processing chambers; and
   at least one load lock having an upper chamber for receiving a micro-environment container therein, and a lower chamber in communication with said transfer chamber;
   said load lock further comprising:
      a separator between said upper and lower chambers, said separator having at least one aperture formed therethrough;
      a movable carrier plate selectably operable to open and close said micro-environment container and to selectably remove a cassette of wafers from said micro-environment container and into said lower chamber, wherein said micro-environment container is supported by said separator to form an impermeable barrier between said lower chamber and said upper chamber; and a semipermeable barrier in said at least one aperture to prevent any particulate material in said upper chamber from entering said lower chamber;

wherein said upper and lower chambers may be simultaneously evacuated.

21. The system of claim 20, wherein said micro-environment container is a SMIF box.

22. The system of claim 20, wherein said semipermeable barrier is a semipermeable membrane.

23. The system of claim 20, wherein said semipermeable barrier is a non-shedding, non-outgassing, high efficiency filtration system.

24. The system of claim 20, wherein said semipermeable barrier is selected from the group consisting of High Efficiency Particulate Air and Ultra Low Particulate Air filters.

25. The system of claim 20, wherein said semipermeable barrier traps particles equal to, or greater than 0.01 μm in size.

26. The system of claim 20, said transfer chamber further comprising an end-effector having one or more wafer transports.

27. The system of claim 20, wherein said load lock is operable with horizontal and vertical wafer loading configurations.

28. The system of claim 20, further comprising means to produce a vacuum in said upper and lower chambers.

* * * * *